United States Patent
Nakamura

(10) Patent No.: US 8,305,145 B2
(45) Date of Patent: Nov. 6, 2012

(54) RECEIVING CIRCUIT

(75) Inventor: Wataru Nakamura, Kanagawa (JP)

(73) Assignee: RENESAS Electronics Corporation, Kawasaki-shi, Kanagawa (JP)

( * ) Notice: Subject to any disclaimer, the term of this patent is extended or adjusted under 35 U.S.C. 154(b) by 51 days.

(21) Appl. No.: 12/929,290

(22) Filed: Jan. 12, 2011

(65) Prior Publication Data

US 2011/0169565 A1   Jul. 14, 2011

(30) Foreign Application Priority Data

Jan. 14, 2010   (JP) .................. 2010-005914

(51) Int. Cl.
*H03F 3/45* (2006.01)

(52) U.S. Cl. ...................................... 330/258

(58) Field of Classification Search ............ 330/69, 330/252, 258, 261
See application file for complete search history.

(56) References Cited

U.S. PATENT DOCUMENTS

| | | | |
|---|---|---|---|
| 5,095,282 A * | 3/1992 | Dayton | 330/69 |
| 6,504,404 B2 | 1/2003 | Uchiki et al. | |
| 6,605,995 B2 | 8/2003 | Toda | |
| 7,405,594 B1 | 7/2008 | Xu | |
| 2003/0071673 A1 | 4/2003 | Jordanger et al. | |

FOREIGN PATENT DOCUMENTS

| | | | |
|---|---|---|---|
| JP | 2002-217653 A | 8/2002 | |
| JP | 2002-314398 A | 10/2002 | |

OTHER PUBLICATIONS

European Search Report dated May 20, 2011.
Munson, Jon. "Easy-to-Use Differential Amplifiers Simplify Balanced Signal Designs—Design Note 333." Linear Technology Corporation, Mar. 2004.

* cited by examiner

*Primary Examiner* — Steven J Mottola
(74) *Attorney, Agent, or Firm* — McGinn IP Law Group, PLLC

(57) ABSTRACT

A receiving circuit in accordance with an exemplary aspect of the present invention includes a first voltage-dividing circuit that outputs a first input signal obtained by voltage division of one of differential signals based on the resistance ratio between first and second resistors, a second voltage-dividing circuit that outputs a second input signal obtained by voltage division of the other of the differential signals based on the resistance ratio between third and fourth resistors, a differential amplifier that amplifies the differential component between the first and second input signals, a common-mode voltage detection circuit that detects the common-mode voltage of the differential signals, and a bias voltage switching circuit that switches the voltage value of a bias voltage based on the common-mode voltage.

5 Claims, 6 Drawing Sheets

RECEIVING CIRCUIT

INCORPORATION BY REFERENCE

This application is based upon and claims the benefit of priority from Japanese patent application No. 2010-005914, filed on Jan. 14, 2010, the disclosure of which is incorporated herein in its entirety by reference.

BACKGROUND

1. Field of the Invention

The present invention relates to a receiving circuit, in particular a receiving circuit that receives differential signals and transmits them to a circuit in the subsequent stage.

2. Description of Related Art

Differential signals are often used for signal transmission/reception between semiconductor devices. When an extraneous noise is mixed into differential signals, the extraneous noise equally affects the common-mode components (or common-mode voltages) of the two signals constituting the differential signals. Meanwhile, the receiving circuit that receives the differential signals generates an output signal based on a differential component obtained by removing the common-mode component from the differential signals. By using differential signals for signal transmission in this manner, the receiving circuit can receive transmission data transmitted by the differential component without being affected by extraneous noises.

However, in general, a receiving circuit is constructed by using a differential amplifier. Therefore, in some cases, the receiving circuit could not accurately receive the differential component of differential signals when the common-mode voltage of the differential signals exceeds the common-mode input range of the receiving circuit. Accordingly, Japanese Unexamined Patent Application Publication Nos. 2002-217653 and 2002-314398 and "Easy-to-Use Differential Amplifiers Simplify Balanced Signal Designs—Design Note 333, Linear Technology Corporation (hereinafter, simply referred to as "Design Note 333")" disclose techniques to extend the common-mode input range of a receiving circuit.

The differential amplification circuit disclosed in Japanese Unexamined Patent Application Publication No. 2002-217653 includes a voltage shift unit located between a differential amplification unit and an input terminal. Then, the differential amplification circuit extends its common-mode input range by shifting the voltage level of an input signal with the voltage shift unit. The semiconductor integrated circuit disclosed in Japanese Unexamined Patent Application Publication No. 2002-314398 detects the common level of differential signals by using a common-level detection circuit. Then, the semiconductor integrated circuit controls the operating current of the differential amplifier by controlling the voltage level of the bias voltage based on the detected common level. In this way, the semiconductor integrated circuit disclosed in Japanese Unexamined Patent Application Publication No. 2002-314398 extends the common-mode input range of the differential amplifier.

However, there is a problem in the differential amplification circuit disclosed in Japanese Unexamined Patent Application Publication No. 2002-217653 that the output of the voltage shift unit is saturated for the common-mode voltage exceeding the power-supply voltage range. Further, the semiconductor integrated circuit disclosed in Japanese Unexamined Patent Application Publication No. 2002-314398 controls only the operating current of the differential amplifier. Therefore, there is also a problem that the common-mode input range cannot be extended over the power-supply voltage range.

Meanwhile, Design Note 333 discloses an example of a differential amplification circuit capable of coping with a common-mode voltage exceeding the power-supply voltage range. FIG. 7 shows a circuit diagram of a differential amplification circuit 100 disclosed in Design Note 333. As shown in FIG. 7, the differential amplification circuit 100 compresses the amplitude level of an input signal Vin by using a voltage-dividing circuit composed of resistors Rg and Rs. Then, the compressed input signal Vin is input to a differential amplifier AMP to obtain an output signal Vout.

SUMMARY

However, the present inventor has found the following problems. In the differential amplification circuit disclosed in Design Note 33, it is necessary to increase the voltage-division ratio of the resistors Rg and Rs according to the voltage level of the common-mode voltage. Such increase in the voltage-division ratio of the resistors could lead to a problem that the voltage gain of the differential amplification circuit is lowered. Further, when the common-mode voltage is compressed by the voltage-dividing circuit composed of resistors, the differential component is also compressed. Therefore, when the voltage-division ratio of the resistors is increased, the magnitude of the differential component is decreased, thus causing a problem that the signal cannot be accurately received.

A first exemplary aspect of the present invention is a receiving circuit including: a first voltage-dividing circuit including first and second resistors connected in series between a first input terminal through which one of differential signals is input and a bias terminal to which a bias voltage is applied, the first voltage-dividing circuit being configured to output a first input signal obtained by voltage division of the one of the differential signals based on a resistance ratio between the first and second resistors; a second voltage-dividing circuit including third and fourth resistors connected in series between a second input terminal through which another of the differential signals is input and the bias terminal, the second voltage-dividing circuit being configured to output a second input signal obtained by voltage division of the another of the differential signals based on a resistance ratio between the third and fourth resistors; a differential amplifier that amplifies the differential component between the first and second input signals; a common-mode voltage detection circuit that detects a common-mode voltage of the differential signals, the common-mode voltage detection circuit being connected between the first and second input terminals; and a bias voltage switching circuit that switches a voltage value of the bias voltage based on the common-mode voltage.

In the receiving circuit in accordance with an exemplary aspect of the present invention, the voltage value of the bias voltage is switched based on the common-mode voltage. In this way, the receiving circuit in accordance with an exemplary aspect of the present invention shifts the voltage level of the first and second input signals to the high-voltage side or the low-voltage side. Further, when the voltage level of the first and second input signals is shifted to the high-voltage side, the voltage level of the first and second input signals supplied to the differential amplifier for the common-mode voltage of the differential signals becomes higher than the voltage level that is determined solely by the resistance ratio. As a result, the common-mode input range of the receiving circuit can be extended to the low-voltage side. On the other hand, when the voltage level of the first and second input signals is shifted to the low-voltage side, the voltage level of the first and second input signals supplied to the differential amplifier for the common-mode voltage of the differential signals becomes lower than the voltage level that is determined solely by the resistance ratio. As a result, the common-mode input range of the receiving circuit can be extended to the high-voltage side. That is, in the receiving circuit in accordance with an exemplary aspect of the present invention, the voltage value of the bias voltage is switched based on the common-mode voltage, so that it is possible to achieve a common-mode input range wider than the common-mode input range determined by the resistance ratio of the first and second voltage-dividing circuits.

According to the receiving circuit in accordance with an exemplary aspect of the present invention, it is possible to extend the common-mode input range without impairing the gain of the receiving circuit.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
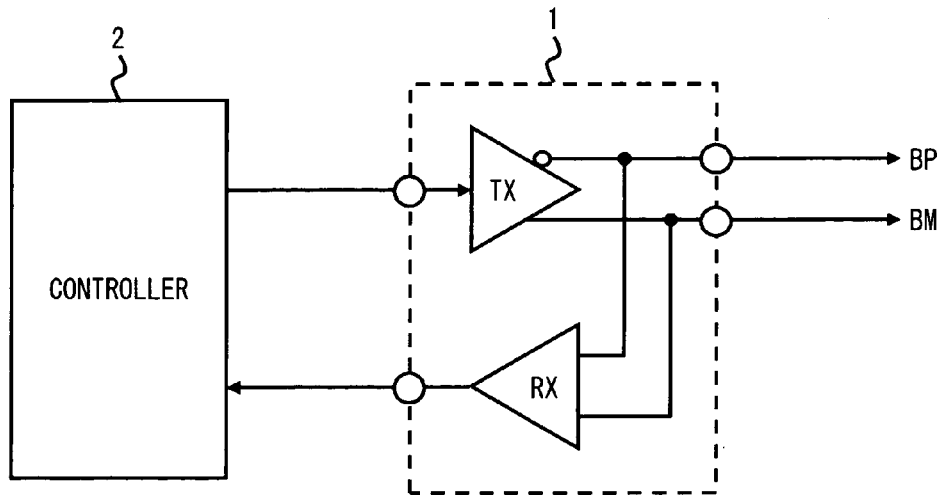
FIG. 1 is a block diagram of a transmitting/receiving circuit in accordance with a first exemplary embodiment of the present invention.

Exemplary embodiments in accordance with the present invention are explained hereinafter with reference to the drawings. A receiving circuit in accordance with this exemplary embodiment is used, for example, as the receiving circuit of a transmitting/receiving circuit. Therefore, FIG. 1 shows a block diagram of a transmitting/receiving circuit 1 in which a receiving circuit in accordance with this exemplary embodiment is installed. As shown in FIG. 1, the transmitting/receiving circuit 1 includes a transmitting circuit TX and a receiving circuit RX. For example, the transmitting circuit TX receives a transmission signal from a processing circuit such as a controller 2, and outputs differential signals based on the received transmission signal. Meanwhile, the receiving circuit RX receives differential signals output from other circuits (not shown), and outputs a resultant signal to the processing circuit such as the controller 2. Although an example of the receiving circuit RX that receives differential signals and outputs a single-end signal is shown in FIG. 1, the receiving circuit RX may output differential signals. Note that the following explanation is made by using a receiving circuit that receives differential signals and outputs a single-end signal as an example.

Figure 2:
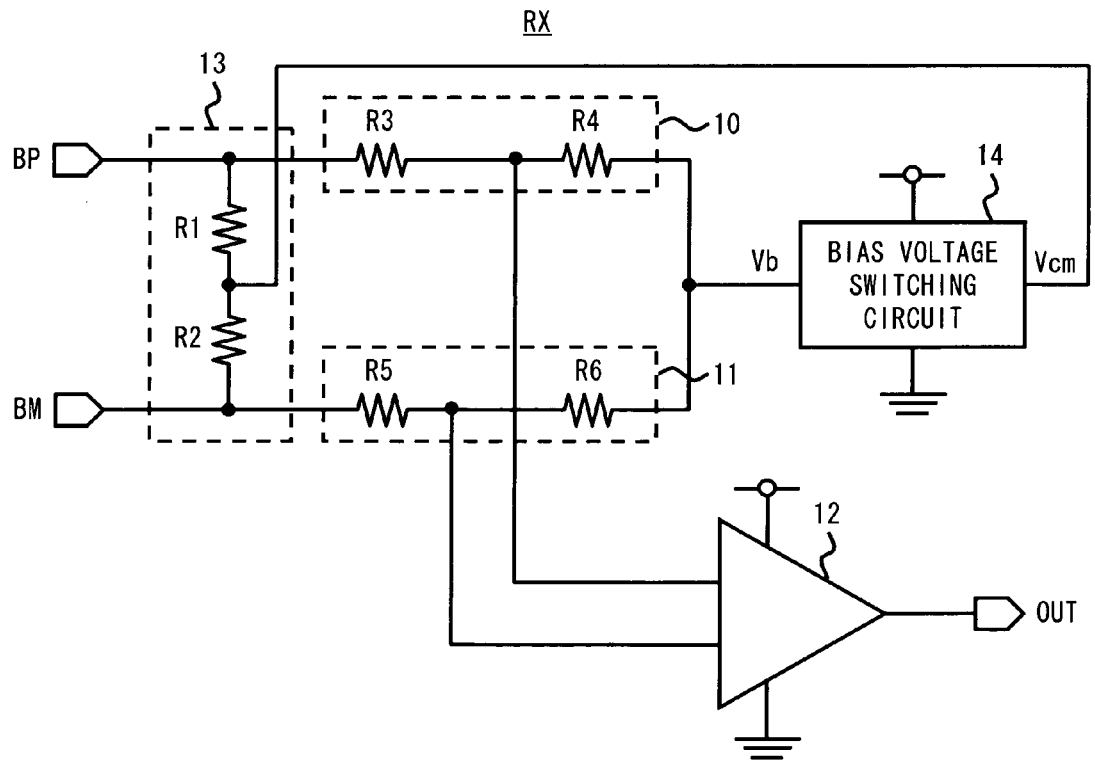
FIG. 2 is a circuit diagram of a receiving circuit in accordance with a first exemplary embodiment of the present invention.

The transmitting/receiving circuit 1 in accordance with an exemplary aspect of the present invention is characterized by its receiving circuit RX. Therefore, the receiving circuit RX is explained hereinafter in detail. FIG. 2 shows a circuit diagram of a receiving circuit RX. As shown in FIG. 2, the receiving circuit RX includes a first voltage-dividing circuit 10, a second voltage-dividing circuit 11, a differential amplifier 12, a common-mode voltage detection circuit 13, and a bias voltage switching circuit 14.

The first voltage-dividing circuit 10 includes resistors R3 and R4. The resistors R3 and R4 are connected in series between a first input terminal through which one of differential signals (e.g., signal BP) is input and a bias terminal to which a bias voltage Vb is applied (e.g., the output terminal of the bias voltage switching circuit 14). Then, the first voltage-dividing circuit 10 outputs a first input signal obtained by the voltage division of the signal BP based on the resistance ratio between the resistors R3 and R4.

The second voltage-dividing circuit 11 includes resistors R5 and R6. The resistors R5 and R6 are connected in series between a second input terminal through which the other of the differential signals (e.g., signal BM) is input and the bias terminal. Then, the second voltage-dividing circuit 11 outputs a second input signal obtained by the voltage division of the signal BM based on the resistance ratio between the resistors R5 and R6.

The differential amplifier 12 amplifies the differential component between the first input signal output by the first voltage-dividing circuit 10 and the second input signal output by the second voltage-dividing circuit 11, and outputs the amplified differential component as an output signal OUT. Note that an assumption is made in the first exemplary embodiment that the differential amplifier 12 includes transistors having P-type conductivity that constitute a differential pair. The differential pair receives the first and second input signals.

The common-mode voltage detection circuit 13 includes resistors R1 and R2. The resistors R1 and R2 are connected between the first and second input terminals. Then, the common-mode voltage detection circuit 13 detects the common-mode voltage Vcm of the differential signals. More specifically, the resistors R1 and R2 have the same resistance value, and therefore the midpoint voltage between the differential signals is output from the connection point of the resistors R1 and R2. Note that the midpoint voltage between the differential signals is equal to the common-mode voltage Vcm of the differential signals.

The bias voltage switching circuit 14 switches the voltage value of the bias voltage Vb based on the common-mode voltage Vcm. More specifically, the bias voltage switching circuit 14 has a threshold voltage at which the voltage value of the bias voltage Vb is switched. Then, when the common-mode voltage Vcm is higher than the threshold voltage (when the common-mode voltage Vcm is at a high level), the bias voltage switching circuit 14 lowers the bias voltage Vb below the voltage value used when the common-mode voltage Vcm is lower than the threshold voltage (when the common-mode voltage Vcm is at a low level). Further, the bias voltage switching circuit 14 switches the bias voltage Vb within the common-mode input range of the differential amplifier 12 in either of the state before and the state after the switching of the voltage value of the bias voltage Vb.

Figure 3:
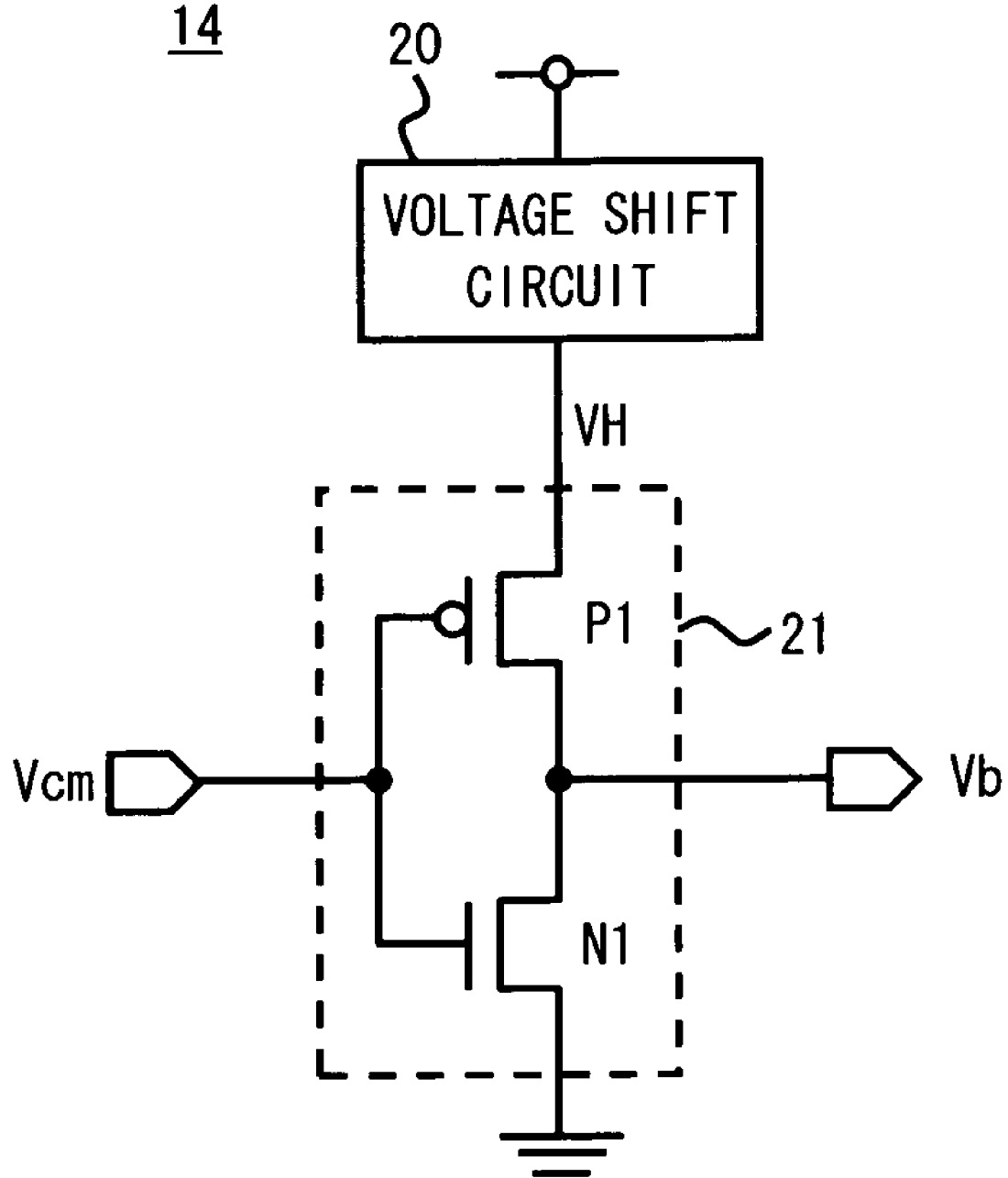
FIG. 3 is a circuit diagram of a bias voltage switching circuit in accordance with a first exemplary embodiment of the present invention.

FIG. 3 shows a detailed circuit diagram of this bias voltage switching circuit 14. As shown in FIG. 3, the bias voltage switching circuit 14 includes a voltage shift circuit 20 and an inverter 21. The voltage shift circuit 20 is disposed between a high-voltage power supply (e.g., power supply VDD) and the inverter 21. Then, the voltage shift circuit 20 outputs a converted voltage VH lower than the power supply VDD by lowering the voltage of the power supply VDD. This voltage shift circuit 20 is implemented, for example, by using a diode or a similar component.

The inverter 21 operates based on the converted voltage VH and a low-voltage power supply (e.g., ground power supply GND). The inverter 21 includes an NMOS transistor N1 and a PMOS transistor P1. The source of the NMOS transistor N1 is connected to the low-voltage power supply. The drains of the NMOS transistor N1 and the PMOS transistor P1 are connected to each other, and the bias voltage Vb is output from their connection point. The source of the PMOS transistor P1 is connected to the output terminal of the voltage shift circuit 20 (e.g., terminal from which the converted voltage VH is output). A common-mode voltage Vcm is applied to the gate of the PMOS transistor P1 and the gate of the NMOS transistor N1. Note that common high-voltage power supply and low-voltage power supply are supplied to both the bias voltage switching circuit 14 and the differential amplifier 12.

Since the inverter 21 operates based on the converted voltage VH and the ground voltage, its threshold voltage becomes lower in comparison to the case where an inverter operates based on the power-supply voltage and the ground voltage. In the inverter 21 in accordance with the first exemplary embodiment, the threshold voltage is shifted from the midpoint voltage between the power-supply voltage and the ground voltage to the ground voltage side. Further, by applying the converted voltage VH lower than the power-supply voltage to the inverter 21, it is possible to lower the output bias voltage Vb below the power-supply voltage.

Figure 4:
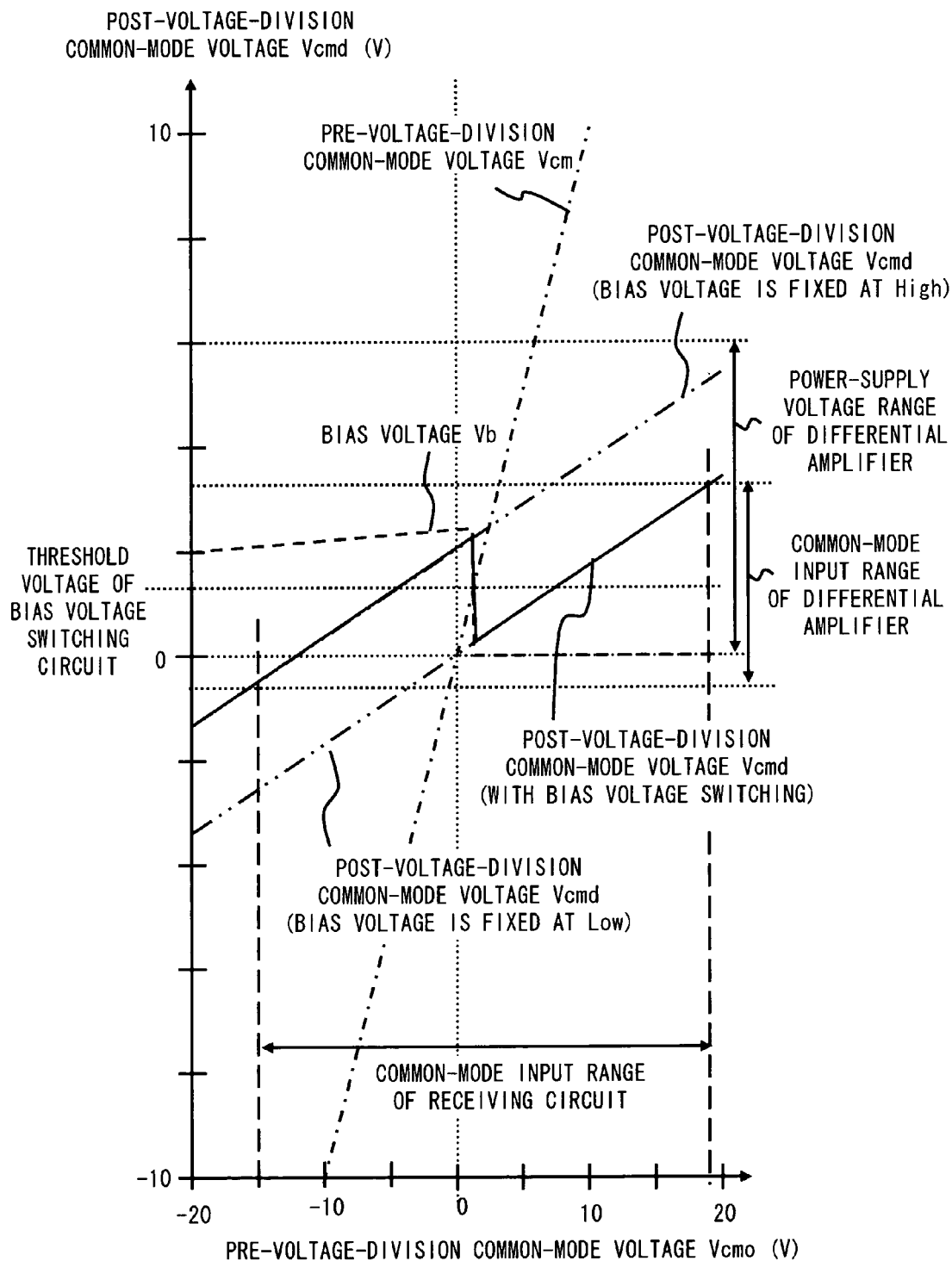
FIG. 4 is a graph showing the common-mode input range of a receiving circuit in accordance with a first exemplary embodiment of the present invention.

Next, the common-mode input range of the receiving circuit RX in accordance with the first exemplary embodiment is explained. FIG. 4 shows a graph showing the common-mode input range of a receiving circuit RX. Note that in the example shown in FIG. 4, voltages ranging from −20V to 20V are input as signals BP and BM on which the voltage division has not been performed yet (hereinafter referred to as "pre-voltage-division signals BP and BM"). Further, the common-mode voltage of the first and second input signals output from the first and second voltage-dividing circuits 10 and 20 are referred to as "post-voltage-division common-mode voltage Vcmd" in the following explanation.

In the graph shown in FIG. 4, the horizontal axis indicates the common-mode voltage Vcmo of the signals BP and BM to be input to the first and second voltage-dividing circuits 10 and 20, and the vertical axis indicates the common-mode voltage Vcmd of the signals BP and BM obtained by the voltage division by the first and second voltage-dividing circuits 10 and 20 (corresponding to the first and second input signals).

As shown in FIG. 4, when the voltage value of the pre-voltage-division common-mode voltage Vcm is lower than the threshold voltage of the bias voltage switching circuit 14, the bias voltage switching circuit 14 outputs a bias voltage Vb at a high level (about 2V in the example shown in FIG. 4). On the other hand, when the voltage value of the pre-voltage-division common-mode voltage Vcm is higher than the threshold voltage of the bias voltage switching circuit 14, the bias voltage switching circuit 14 outputs a bias voltage Vb at a low level (roughly ground voltage in the example shown in FIG. 4). Then, in the receiving circuit RX, the voltage value of the post-voltage-division common-mode voltage Vcmd is switched in response to the switching of the bias voltage Vb.

As shown in FIG. 4, the switching of the voltage value of the bias voltage Vb in the receiving circuit RX is performed in a state where the voltage value of the post-voltage-division common-mode voltage Vcmd obtained when the bias voltage Vb is fixed at a high level and the voltage value of the post-voltage-division common-mode voltage Vcmd obtained when the bias voltage Vb is fixed at a low level are both within the common-mode input range of the differential amplifier 12. More specifically, when the voltage value of the pre-voltage-division common-mode voltage Vcm is lower than the threshold voltage of the bias voltage switching circuit 14 (when the pre-voltage-division common-mode voltage Vcm is at a low level), the receiving circuit RX generates first and second input signals (post-voltage-division common-mode voltage Vcmd) based on the high-level bias voltage Vb and the pre-voltage-division common-mode voltage Vcm. On the other hand, when the voltage value of the pre-voltage-division common-mode voltage Vcm is higher than the threshold voltage of the bias voltage switching circuit 14 (when the pre-voltage-division common-mode voltage Vcm is at a high level), the receiving circuit RX generates post-voltage-division common-mode voltage Vcmd based on the low-level bias voltage Vb and the pre-voltage-division common-mode voltage Vcm.

Post-voltage-division common-mode voltages Vcmd that are generate before and after the switching of the bias voltage Vb are generated based on the same resistance ratio. From this fact, post-voltage-division common-mode voltages Vcmd that are generate before and after the switching of the bias voltage Vb have such a relation that their voltage values are shifted from each other. That is, the receiving circuit RX shifts the voltage value of the post-voltage-division common-mode voltage Vcmd based on the voltage value of the pre-voltage-division common-mode voltage Vcm.

In particular, the receiving circuit RX shifts the voltage level of the post-voltage-division common-mode voltage Vcmd to the high-voltage side during a period in which the pre-voltage-division common-mode voltage Vcm is at a low level by raising the bias voltage Vb to a high level, whereas it shifts the voltage level of the post-voltage-division common-mode voltage Vcmd to the low-voltage side during a period in which the pre-voltage-division common-mode voltage Vcm is at a high level.

The common-mode input range of the receiving circuit RX corresponds to the range of the pre-voltage-division common-mode voltage Vcm in which the obtained post-voltage-division common-mode voltage Vcmd falls within the common-mode input range of the differential amplifier 12. In the receiving circuit RX, the bias voltage switching circuit 14 switches the voltage value of the bias voltage Vb so that the common-mode input range of the receiving circuit RX is extended. This feature is explained hereinafter in a more detailed manner.

When the voltage value of the bias voltage Vb obtained by the bias voltage switching circuit 14 is fixed at a high level, the common-mode input range of the receiving circuit RX is roughly from −15V to 8V. Further, in this case, the possible voltage value of the post-voltage-division common-mode voltage Vcmd ranges roughly from −1.4V to 5.4V. On the other hand, when the voltage value of the bias voltage Vb obtained by the bias voltage switching circuit 14 is fixed at a low level, the common-mode input range of the receiving circuit RX is roughly from −3V to 19V. Further, in this case, the possible voltage value of the post-voltage-division common-mode voltage Vcmd ranges roughly from −3.4V to 3.4V. That is, when the pre-voltage-division common-mode voltage Vcm is within the range of −3V to 8V, the post-voltage-division common-mode voltage Vcmd always falls within the common-mode input range of the differential amplifier 12 regardless of whether the bias voltage is at a high level or at a low level.

In the receiving circuit RX, the bias voltage switching circuit 14 has a threshold voltage at or near 1.4V. That is, when the pre-voltage-division common-mode voltage Vcm is lower than 1.4V, the receiving circuit RX generates a post-voltage-division common-mode voltage Vcmd based on the high-level bias voltage Vb, whereas when the pre-voltage-division common-mode voltage Vcm is higher than 1.4V, it generates a post-voltage-division common-mode voltage Vcmd based on the low-level bias voltage Vb. With the operation like this, the lower-limit value of the common-mode input range of the receiving circuit RX is −15V that is determined based on the high-level bias voltage Vb, and the upper-limit value of the common-mode input range of the receiving circuit RX is 19V that is determined based on the low-level bias voltage Vb.

As explained above, when the pre-voltage-division common-mode voltage Vcm is at a low level, the receiving circuit RX in accordance with the first exemplary embodiment can switch the voltage value of the bias voltage Vb so that the level of the voltage value of the post-voltage-division common-mode voltage Vcmd is shifted to the high-voltage side. By doing so, the receiving circuit RX can extend the common-mode input range to the low-voltage side. Further, when the pre-voltage-division common-mode voltage Vcm is at a high level, the receiving circuit RX in accordance with the first exemplary embodiment can switch the voltage value of the bias voltage Vb so that the level of the voltage value of the post-voltage-division common-mode voltage Vcmd is shifted to the low-voltage side. By doing so, the receiving circuit RX can extend the common-mode input range to the high-voltage side. That is, the receiving circuit RX in accordance with the first exemplary embodiment of the present invention can extend the common-mode input range by switching the bias voltage Vb without raising the voltage-division ratio in the first and second voltage-dividing circuits 10 and 11.

Further, the receiving circuit RX in accordance with the first exemplary embodiment can ensure a sufficient common-mode input range even when the voltage-division ratio in the first and second voltage-dividing circuits 10 and 11 is set to a low value. Therefore, it is possible to increase the gain for the differential component in the receiving circuit RX.

Second Exemplary Embodiment

In the receiving circuit RX in accordance with the first exemplary embodiment, the differential pair of the differential amplifier 12 is formed by using transistors having P-type conductivity. In contrast to this, when the differential pair is formed by using transistors having N-type conductivity, the common-mode input range of the differential amplifier 12 shifts to the high-voltage side. Therefore, when the differential pair is formed by using transistors having N-type conductivity, it is necessary to change the threshold of the bias voltage switching circuit 14. Further, it is also necessary to change the high-level voltage and low-level voltage of the bias voltage Vb.

Figure 5:
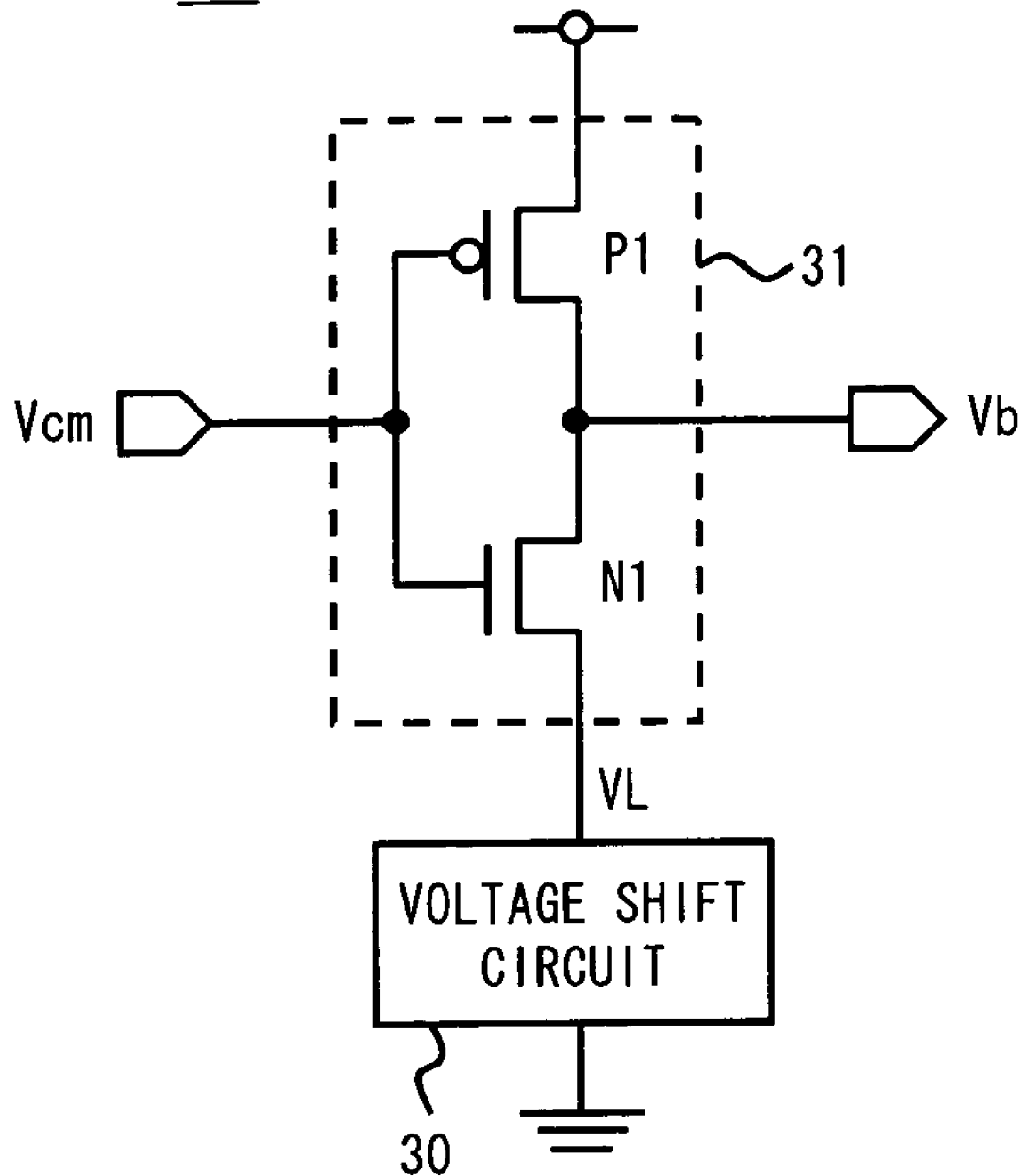
FIG. 5 is a circuit diagram of a bias voltage switching circuit in accordance with a second exemplary embodiment of the present invention.

Accordingly, FIG. 5 shows a circuit diagram of a bias voltage switching circuit 14a conforming to a differential pair composed of transistors having N-type conductivity. As shown in FIG. 5, the bias voltage switching circuit 14a includes a voltage shift circuit 30 and an inverter 31. The voltage shift circuit 30 is disposed between a low-voltage power supply (e.g., ground power supply GND) and the inverter 31. Then, the voltage shift circuit 30 outputs a converted voltage VL higher than the ground voltage. This voltage shift circuit 30 is implemented, for example, by using a diode or a similar component.

The inverter 31 operates based on the converted voltage VL and a high-voltage power supply (e.g., power supply VDD). The inverter 31 includes an NMOS transistor N1 and a PMOS transistor P1. The source of the PMOS transistor P1 is connected to the high-voltage power supply. The drains of the PMOS transistor P1 and the NMOS transistor N1 are connected to each other, and the bias voltage Vb is output from their connection point. The source of the NMOS transistor N1 is connected to the output terminal of the voltage shift circuit 30 (e.g., terminal from which the converted voltage VL is output). A common-mode voltage Vcm is applied to the gate of the PMOS transistor P1 and the gate of the NMOS transistor N1. Note that common high-voltage power supply and low-voltage power supply are supplied to both the bias voltage switching circuit 14a and the differential amplifier 12.

Since the inverter 31 operates based on the converted voltage VL and the power-supply voltage, its threshold voltage becomes higher in comparison to the case where an inverter operates based on the power-supply voltage and the ground voltage. In the inverter 31 in accordance with the second exemplary embodiment, the threshold voltage is shifted from the midpoint voltage between the power-supply voltage and the ground voltage to the power-supply voltage side. Further, by applying the converted voltage VL higher than the ground voltage to the inverter 31, it is possible to raise the output bias voltage Vb above the ground voltage.

Figure 6:
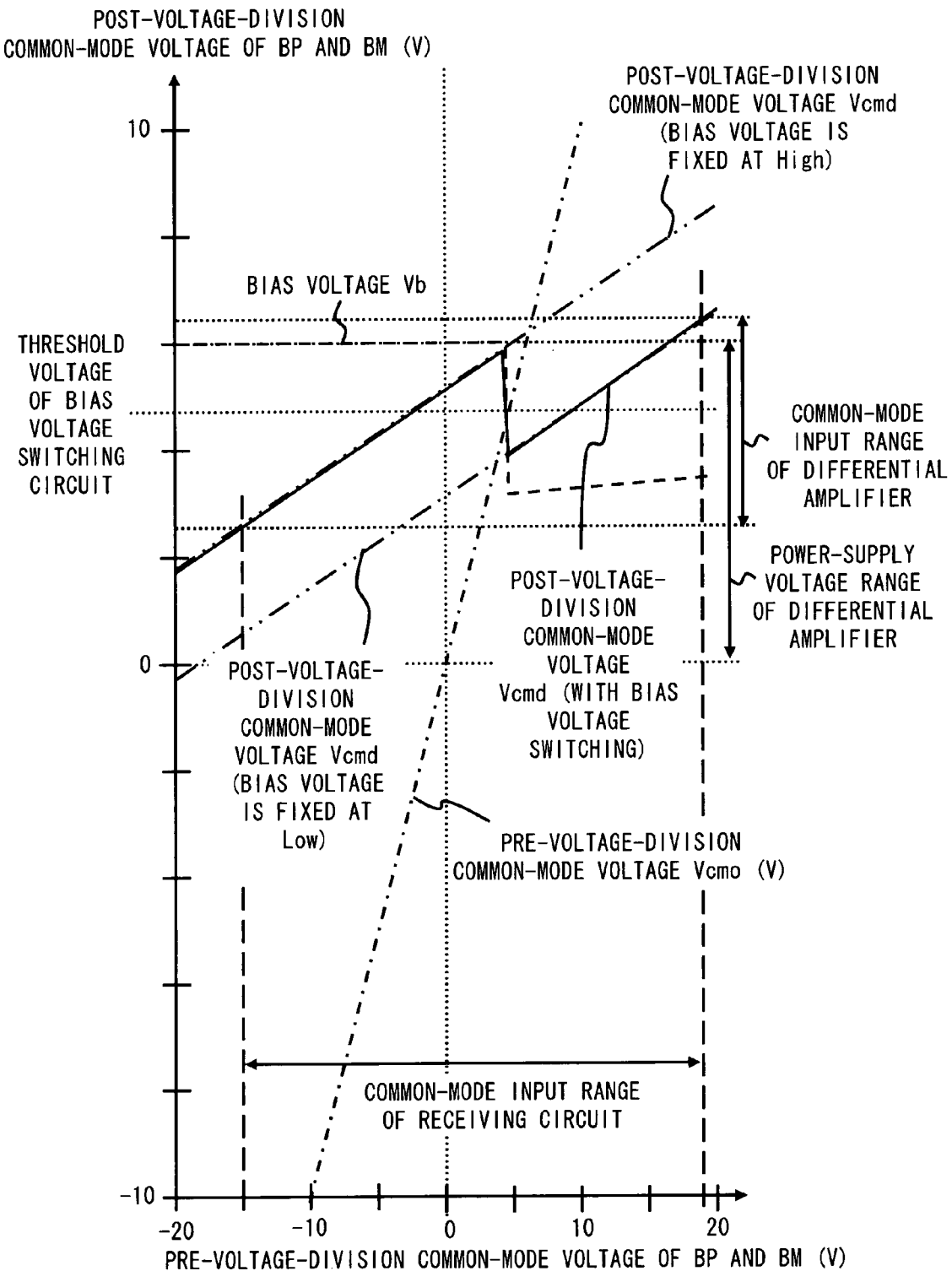
FIG. 6 is a graph showing the common-mode input range of a receiving circuit in accordance with a second exemplary embodiment of the present invention.
Figure 7:
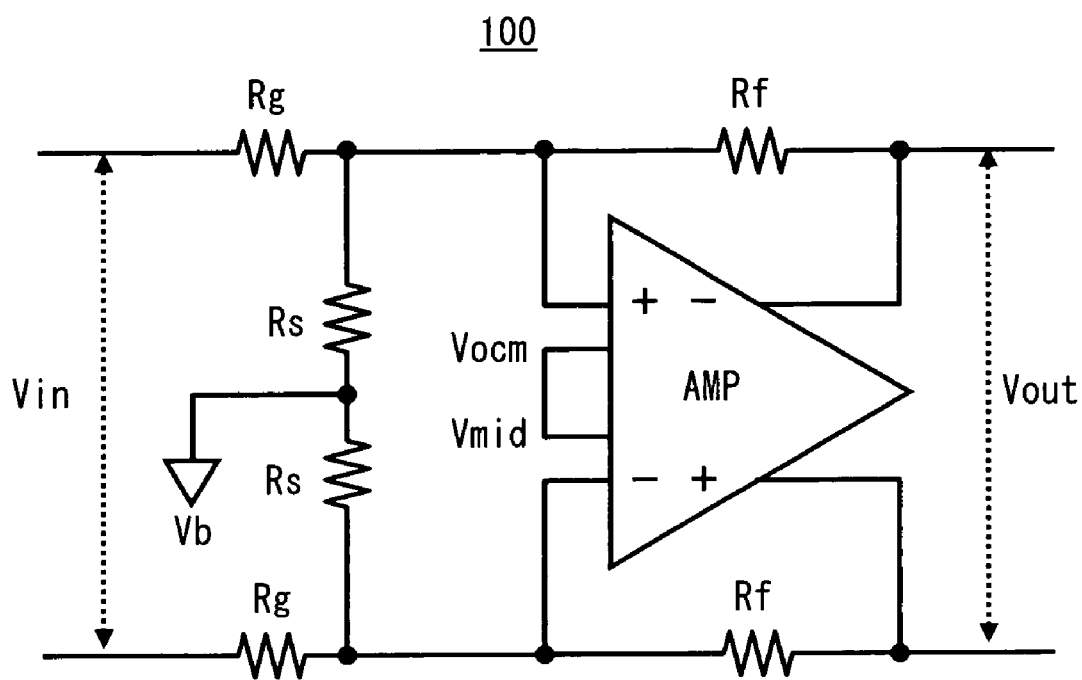
FIG. 7 is a circuit diagram of a differential amplification circuit disclosed in Design Note 333.

Next, the common-mode input range of the receiving circuit RX in accordance with the second exemplary embodiment is explained. FIG. 6 shows a graph showing the common-mode input range of a receiving circuit RX in accordance with the second exemplary embodiment. As shown in FIG. 6, the operation of the receiving circuit RX in accordance with the second exemplary embodiment is equivalent to the operation of the receiving circuit RX in accordance with the first exemplary embodiment except that the common-mode input range of the differential amplifier, the post-voltage-division common-mode voltage Vcmd, and the threshold voltage are shifted to the high-voltage side. That is, the operation of the receiving circuit RX in accordance with the second exemplary embodiment is substantially the same as that of the receiving circuit RX in accordance with the first exemplary embodiment. The shift of the operating range like this can be implemented by the change of the conductivity of the transistors constituting the differential pair, the replacement of the bias voltage switching circuit 14 by the bias voltage switching circuit 14a, and the change of the resistance ratio of the voltage-dividing circuit.

As described above, the voltage values before and after the switching of the bias voltage Vb and the threshold voltage of the bias voltage switching circuit 14a can be changed as appropriate according to the common-mode input range of the differential amplifier 12 that receives the post-voltage-division common-mode voltage Vcmd.

The first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above. For example, the above-shown configurations of the bias voltage switching circuits are merely examples, and similar operations can be achieved by using other types of circuits.

Furthermore, it is noted that, Applicant's intent is to encompass equivalents of all claim elements, even if amended later during prosecution.

What is claimed is:

1. A receiving circuit comprising:
a first voltage-dividing circuit comprising first and second resistors connected in series between a first input terminal through which one of differential signals is input and a bias terminal through which a bias voltage is input, the first voltage-dividing circuit being configured to output a first input signal obtained by voltage division of the one of the differential signals based on a resistance ratio between the first and second resistors;
a second voltage-dividing circuit comprising third and fourth resistors connected in series between a second input terminal through which another of the differential signals is input and the bias terminal, the second voltage-dividing circuit being configured to output a second input signal obtained by voltage division of the another of the differential signals based on a resistance ratio between the third and fourth resistors;
a differential amplifier that amplifies the differential component between the first and second input signals;
a common-mode voltage detection circuit that detects a common-mode voltage of the differential signals, the common-mode voltage detection circuit being connected between the first and second input terminals; and
a bias voltage switching circuit that switches a voltage value of the bias voltage based on the common-mode voltage,
wherein when the common-mode voltage is less than a threshold voltage at which the voltage value of the bias voltage is switched, the bias voltage switching circuit sets the bias voltage to a voltage value greater than the voltage value used when the common-mode voltage is greater than the threshold voltage.

2. The receiving circuit according to claim 1, wherein the bias voltage falls within a common-mode input range of the differential amplifier in either of a state before and a state after the switching of the voltage level of the bias voltage.

3. The receiving circuit according to claim 1, wherein the bias voltage switching circuit operates based on common high-voltage power supply and low-voltage power supply that are supplied to both the bias voltage switching circuit and the differential amplifier, and
wherein when the differential amplifier comprises transistors having N-type conductivity that constitute a differential pair, the threshold voltage at which the bias voltage switching circuit switches the voltage value of the bias voltage has a voltage value that is shifted from a midpoint voltage between the high-voltage power supply and the low-voltage power supply to the high-voltage power supply side, whereas when the differential amplifier comprises transistors having P-type conductivity that constitute the differential pair, the threshold voltage has a voltage value that is shifted from the midpoint voltage between the high-voltage power supply and the low-voltage power supply to the low-voltage power supply side.

4. The receiving circuit according to claim 1, wherein the bias voltage switching circuit comprises:
a voltage shift circuit that outputs a converted voltage by shifting a level of a voltage of either one of common high-voltage power supply and low-voltage power supply that are supplied to both the bias voltage switching circuit and the differential amplifier, and
an inverter that operates based on a voltage of another of the common high-voltage power supply and low-voltage power supply and the converted voltage.

5. The receiving circuit according to claim 1, wherein
when the differential amplifier comprises transistors having N-type conductivity that constitute a differential pair, a voltage shift circuit is disposed between the low-voltage power supply and an inverter and outputs the converted voltage greater than the voltage value of the low-voltage power supply, and
when the differential amplifier comprises transistors having P-type conductivity that constitute the differential pair, the voltage shift circuit is disposed between the high-voltage power supply and the inverter and outputs the converted voltage less than the voltage value of the high-voltage power supply.

* * * * *